United States Patent
Clabes et al.

(10) Patent No.: US 6,654,943 B2
(45) Date of Patent: Nov. 25, 2003

(54) METHOD, SYSTEM, AND COMPUTER PROGRAM PRODUCT FOR CORRECTING ANTICIPATED PROBLEMS RELATED TO GLOBAL ROUTING

(75) Inventors: Joachim Gerhard Clabes, Austin, TX (US); Thomas Edward Rosser, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 09/974,984

(22) Filed: Oct. 11, 2001

(65) Prior Publication Data

US 2003/0074645 A1 Apr. 17, 2003

(51) Int. Cl.$^7$ .............................................. G06F 17/50
(52) U.S. Cl. ............................ 716/13; 716/12; 716/14; 716/15; 716/16
(58) Field of Search ............................ 716/3–6, 8–16, 716/18

(56) References Cited

U.S. PATENT DOCUMENTS 5,282,148 A * 1/1994 Poirot et al. ................... 716/6
6,453,446 B1 * 9/2002 van Ginneken ................ 716/3

* cited by examiner

Primary Examiner—Leigh M. Garbowski
Assistant Examiner—Naum B Levin
(74) Attorney, Agent, or Firm—Duke W. Yee; Mark E. McBurney; Lisa L. B. Yociss

(57) ABSTRACT

A method, system, and computer product are disclosed for correcting anticipated problems related to global routing during logic synthesis. Synthesis is begun of a circuit design that includes multiple logic functions. During the synthesis, multiple logic books are selected to use to implement the logic function. Also during synthesis, at least one of the logic books is identified that is sensitive to a change in output wire capacitance of the identified logic book, where a value of the output wire capacitance is related to a routing of the wire. A strength of each identified logic book is then increased.

63 Claims, 7 Drawing Sheets

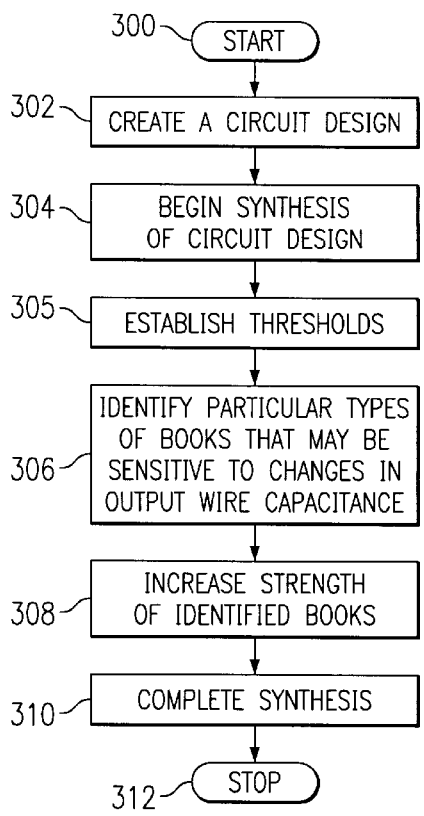

FIG. 3

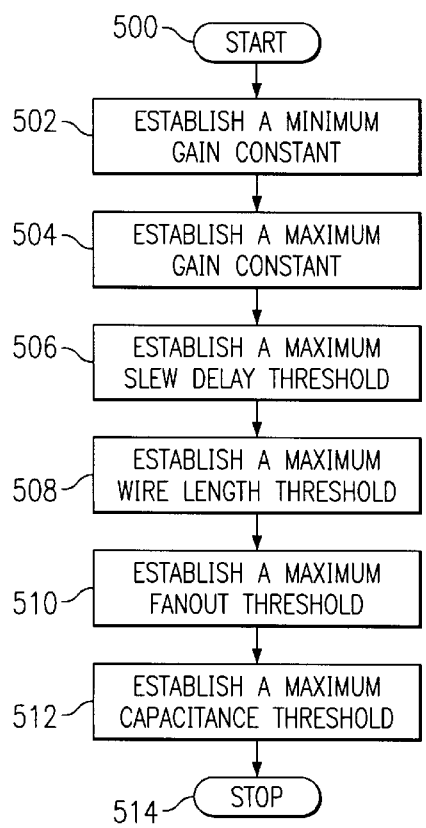

```
        }
                else {
                        MsgStrPrintf ("%s: (W) Could not find suitable
alternative def for wimpy usage box
%s\n" , routine, usage_box_name(ub,C)) ;
                }
                        }
                    }
                }
            }
        } /* of no KEEP_BHC hide flag */
        else {
                MsgStrPrintf ("%s: (W) KEEP_BHC hide flag was set for wimpy
usage box %s\n" ,routine, usage_box_name(ub,C)) ;
            }
        } /* of need to power up wimpy box */
    } /* for output pins of this box */
} /* for boxes in the model */
MsgStrPrintf ("%s: Found %d wimpy books and fixed
%d\n" , routine, found, fixed) ;
```

FIG. 6A

```
BETARATIO_kwd           =
locate_or_create_keyword_def(CLAS_RULE_BOX, "BETARATIO", VARTYPE_FLOAT ,
C) ;
   avg_xy_cap = (cap_per_x_micron + cap_per_y_micron) / 2;
   NOR_tib  = locate_def_box("NOR", C) ;
   for(ub=f_usage_box(lcb_drv.pb,C) ;ub ;ub=n_usage_box(ub,C) ) {
     dbox = get_def_box_from_usage_box(ub,C) ;
     if(cte_is_LCB(dbox) || cte_is_DRV(dbox) || cte_is_latch(ub))
continue;
     ub_tib = def_tib_function(dbox,C);
     num_inputs = 0;
     input_cap = 0;
     for(upin=f_usage_pin(ub,INPUT_PIN,C) ;upin;upin=n_usage_pin(upin,C))
{
       num_inputs++;
       net_pincap = cte_get_rule_pincap((NETWORK_PIN)upin) ;
       input_cap = input_cap + net_pincap.N;
     }
     input_cap = input_cap / num_inputs;

for(upin=f_usage_pin(ub,OUTPUT_PIN,C) ;upin;upin=n_usage_pin(upin,C)) { pin_slew = 0;
     this_slew = get_worst_em_slew( (TIMING_POINT) upin, C ) ;
     if (this_slew > pin_slew) pin_slew = this_slew;
     this_slew = get_worst_lm_slew( (TIMING_POINT) upin, C ) ;
     if (this_slew > pin_slew) pin_slew = this_slew;
     if(pin_slew>max_slew) high_slew_net = true;
     else high_slew_net = false;

long_net = false
     net = get_net_from_usage_pin(upin,C) ;
     if(net==NULL) continue;
     net_pincap = cte_find_total_net_pincap(net) ;
     pin_cap = net_pincap.N;
     wire_cap = steinerWireCap (net,lcb_drv.def_amode,NOMINAL,C) ;
     output_cap = wire_cap + pin_cap;
     gain = output_cap / input_cap;
     if(high_slew_net==false) {
       if(gain<min_gain) continue;
       if((wire_cap/output_cap)<max_cap_ratio) continue;
     }
```

*FIG. 6B*

```
gain_pins = num_inputs;
        // If box is a NOR, increase gain_pins to effectively lower
scenic_gain threshold
        if(ub_tib==NOR_tib) gain_pins++;
        /* If single input gate, scenic gain should be equal to max_gain
*/
        /* If 4 or more input pins, scenic gain should be equal to
min_gain */
        scenic_gain = max_gain - ((max_gain - min_gain)/3) * (gain_pins-
1) ;
        if(scenic_gain<min_gain) scenic_gain = min_gain;
        if(gain<scenic_gain && high_slew_net==false) continue;

total_wire_length = wire_cap  / avg_xy_cap;
        if(total_wire_length>max_length) long_net = true;
        num_fanout = count_net_pins(net,SINK_PIN,C) ;
        if(num_fanout>max_fanout) long_net = true;
        if((wire_cap/output_cap)>max_cap_ratio) long_net = true;

if(high_slew_net && (total_wire_length>(max_length/2))) long_net
= true;

if(long_net) { /* need to power up wimpy box */
          found++;
          if(1 || lcb_drv.trace>=WHYWHAT)
            MsgStrPrintf("%s: Box %s of type %s has a gain of %7.2f and
scenic_gain of %7.2f and needs to be fixed\n",
routine, usage_box_name(ub,C) ,def_box_name(dbox,C) ,gain,scenic_gain) ;
        if(!syn_hide_bit_get(ub,HIDE_KEEP_BHC)) {
            if(rbox=get_rule_box_from_def_box(dbox,SYNTH_VIEW_NAME, C ))
}
            if(!
locate_keyword_value ((OBJECT) rbox,BETARATIO_kwd,&keyval,C)) {
                original_beta = -1; /*prevent BETARATIO based selection
*/
            }
            else {
                original_beta = *(float *)keyval;
    //        MsgStrPrintf ("%s: BETARATIO for %s is
%7.2f\n",routine,def_box_name(dbox,C) ,original_beta);
            }
            rbox_size = locate_size(rbox,C) ;
            min_xl = size_xlow(rbox_size,C) ;
            max_dx = size_xwidth(rbox_size,C) ;
            parent_def = NULL;
            parent_rbox = NULL;
            parent = power_parent(dbox,C) ;
            if(parent) {
                if(parent_def = locate_def_box(parent,C)) {
                    parent_rbox = get_rule_box_from_def_box(parent_def,
SYNTII_VIEW_NAME, C) ;
                    best_child_def = NULL;
                    best_child_icells = 999999;
```

```
//                    MsgStrPrintf ("%s: BETARATIO for %s is
%7.2f\n", routine, def_box_name(child_def,C) ,this_beta) ;
                                }
                                if(original_beta!=this_beta) continue;
                        }
                }
if(child_rbox=get_rule_box_from_def_box(child_def,PHYSICAL_VIEW_NAME, C
)) {
                        rbox_size = locate_size(child_rbox,C) ;
                        xl = size_xlow(rbox_size,C) ;
                        dx = size_xwidth(rbox_size,C) ;
                        child_icells = dx-xl;
                        //MsgStrPrintf ("%s: Child box %s has %i
icells\n",routine,def_box_name(child_def,C),child_icells) ;
                        /* calculate average input pin cap */
                        child_input_cap = 0;
                                num_inputs = 0;
for(dpin=f_def_pin(child_def,INPUT_PIN,C) ;dpin;dpin=n_def_pin(dpin,C))
{
                                child_input_cap = child_input_cap +
rule_pin_capacitance(dpin,NOMINAL,C) ;
                                        num_inputs++;
                                }
                        child_input_cap = child_input_cap / num_inputs;
                        /* find gain if this book is selected */
                        child_gain = output_cap / child_input_cap;
                        if(child_gain>scenic_gain) continue; /* this child
to wimpy too */
                        /* if gain is OK, pick smallest icell book */
                        if (child_icells<=best_child_icells) {
                            best_child_icells = child_icells;
                            best_child_def = child_def;
                        }
                    }
                }
                delete_synrule_cursor(&src,C) ;
                if(best_child_def!=NULL && best_child_def!=dbox) {
                    if (1 || lcb_drv.trace>=WHYWHAT) {
                        child_input_cap = 0;
                                num_inputs = 0;
for(dpin=f_def_pin(best_child_def,INPUT_PIN,C) ;dpin=dpin=n_def_pin(dpin
,C)) {
                                child_input_cap = child_input_cap +
rule_pin_capacitance(dpin,NOMINAL,C) ;
                                        num_inputs++;
                                }
                        child_input_cap = child_input_cap / num_inputs;
                        child_gain = output_cap / child_input_cap;
                            MsgStrPrintf ("          Selected child box %s with
%i icells output_cap=%7.2f average child_input_cap=%7.2f for a gain of
%7.2f\n",
```

FIG. 6C

METHOD, SYSTEM, AND COMPUTER PROGRAM PRODUCT FOR CORRECTING ANTICIPATED PROBLEMS RELATED TO GLOBAL ROUTING

BACKGROUND OF THE INVENTION

1. Technical Field

The present invention relates generally to the field of integrated circuit design, and, more specifically, to the field of logic synthesis of electronic circuit designs. Yet more specifically, the present invention relates to a method, system, and computer program product for correcting anticipated problems related to global routing during logic synthesis.

2. Description of Related Art

Microelectronic integrated circuits consist of a large number of electronic components that are fabricated by layering several different materials on a silicon base or wafer. The design of an integrated circuit transforms a circuit description into a geometric description which is known as a layout. The process of converting the functional specifications of an electronic circuit into a layout is called the physical design.

The objective of physical design is to determine an optimal arrangement of devices in a plane or in a three dimensional space, and an efficient interconnection or routing scheme between the devices to obtain the desired functionality.

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins.

The input to the physical design problem is a circuit diagram, and the output is the layout of the circuit. This is accomplished in several stages including partitioning, floor planning, placement, routing and compaction.

The objective of the routing phase is to complete the interconnections between cells according to the specified netlist. First, the space not occupied by cells, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the cells of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

Due to the large number of components and the exacting details required by the fabrication process, physical design is not practical without the aid of computers. As a result, most phases of physical design extensively use Computer Aided Design (CAD) tools.

During logic synthesis, a high-level electronic circuit design is converted into a list of books and their interconnections, called the "netlist." A "book" refers herein to an identifiable primitive function (i.e., "cell"). This includes a pre-designed circuit for performing a certain Boolean function, together with certain information about the circuit. During the synthesis process, a strength for each book is selected. Assumptions are made during the selection of the strength of each book about the global routing of the wiring of the circuit. For example, it is assumed that the wire will be reasonable in length. However, the actual wire after routing may be "scenic" in that it does not go straight between the output pin of one book and the input pin of the load book. When this occurs, some books that are the source of the wire may have problems because they may now be too small to drive the actual load represented by the actual wire. Correcting this after the fact causes an "extra" iteration though the physical design process, resulting in extra time to market and reduced profit.

Therefore, a need exists for a method, system, and product for correcting anticipated problems related to global routing during logic synthesis.

SUMMARY OF THE INVENTION

A method, system, and computer product are disclosed for correcting anticipated problems related to global routing during logic synthesis. Synthesis is begun of a circuit design that includes multiple logic functions. During the synthesis, multiple logic books are selected to use to implement the logic function. Also during synthesis, at least one of the logic books is identified that is sensitive to a change in output wire capacitance of the identified logic book, where a value of the output wire capacitance is related to a routing of the wire. A strength of each identified logic book is then increased.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 is a high level flow chart which depicts the correction of anticipated problems related to global routing in accordance with the present invention;

FIG. 5 is a high level flow chart which depicts establishing thresholds to be used during the identification process in accordance with the present invention; and FIGS. 6A–6D depict software that may be used to implement the present invention.

DETAILED DESCRIPTION OF THE PREFERRED EMBODIMENT

A preferred embodiment of the present invention and its advantages are better understood by referring to the figures, like numerals being used for like and corresponding parts of the accompanying figures.

The invention is preferably realized using a well-known computing platform, such as an IBM RS/6000 server running the IBM AIX operating system. However, it may be realized in other popular computer system platforms, such as an IBM personal computer running the Microsoft Windows operating system or a Sun Microsystems workstation running operating systems such as UNIX or LINUX, without departing from the spirit and scope of the invention.

The present invention is a method, system, and computer product for correcting anticipated problems related to global routing during logic synthesis. A circuit design is first created and the logic synthesis of the design is begun. During the synthesis, particular books are identified as being sensitive to changes in their output wire capacitance. The strength of the identified books is then increased to either eliminate or reduce the effects of this sensitivity.

Books having a small slew delay and a low gain are not identified as being sensitive. Therefore, the strength of these books is unchanged.

Books that have either a large slew delay or a large gain as well as at least one of the following are identified as being sensitive: (1) a total output wire length over a threshold, (2) the total number of sink pins, i.e. the fanout, over a threshold, (3) a large slew delay in combination with a relatively long total output wire, or (4) the ratio of the output wire capacitance to the total output capacitance of the book is over a threshold. Books that have these characteristics are identified as being sensitive to changes, such as increases, in output wire capacitance. The strength of these identified books is then increased avoiding physical design iterations.

A slew delay is the amount of time it takes a signal to either rise from 10% to 90% or fall from 90% to 10% of its final value.

Figure 1:
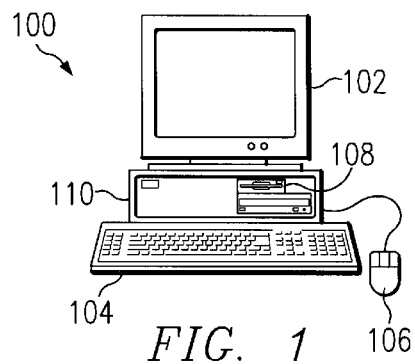
FIG. 1 is a pictorial representation which depicts a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 102, a video display terminal 104, a keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
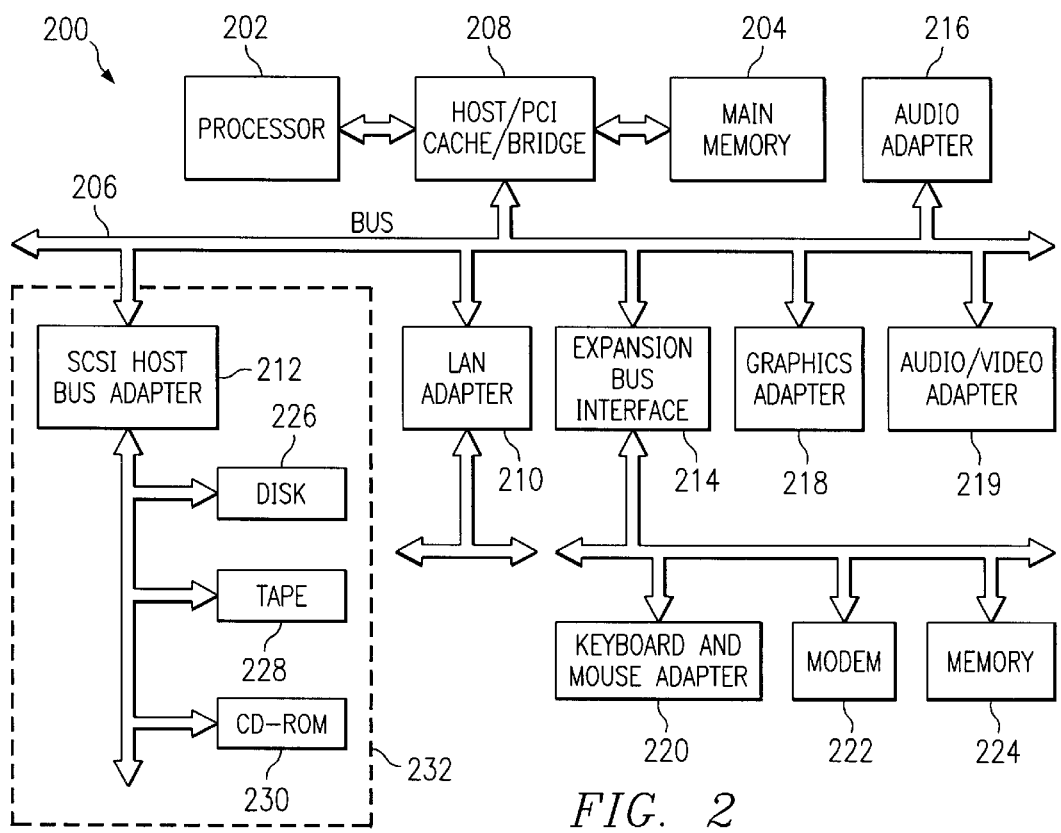
FIG. 2 is a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

FIG. 3 is a high level flow chart which depicts the correction of anticipated problems related to global routing in accordance with the present invention. The process starts as depicted by block 300 and thereafter passes to block 302 which illustrates creating a circuit design. Next, block 304 depicts beginning the logic synthesis of a circuit design. Block 305, then illustrates establishing and setting thresholds. The process of establishing and setting thresholds is explained in more detail with reference to FIG. 5.

Thereafter, block 306 illustrates the identification of particular types of books that may be sensitive to changes in the output wire capacitance of the books. Each book of the circuit design is evaluated in order to identify the books that are sensitive to changes in output wire capacitance. The process then passes to block 308 which depicts increasing the strength of the identified books. The process described by blocks 306 and 308 are described in more detail in FIGS. 4A–4B. Next, block 310 illustrates completing the logic synthesis. The process then terminates as depicted by block 312.

Figure 4A:
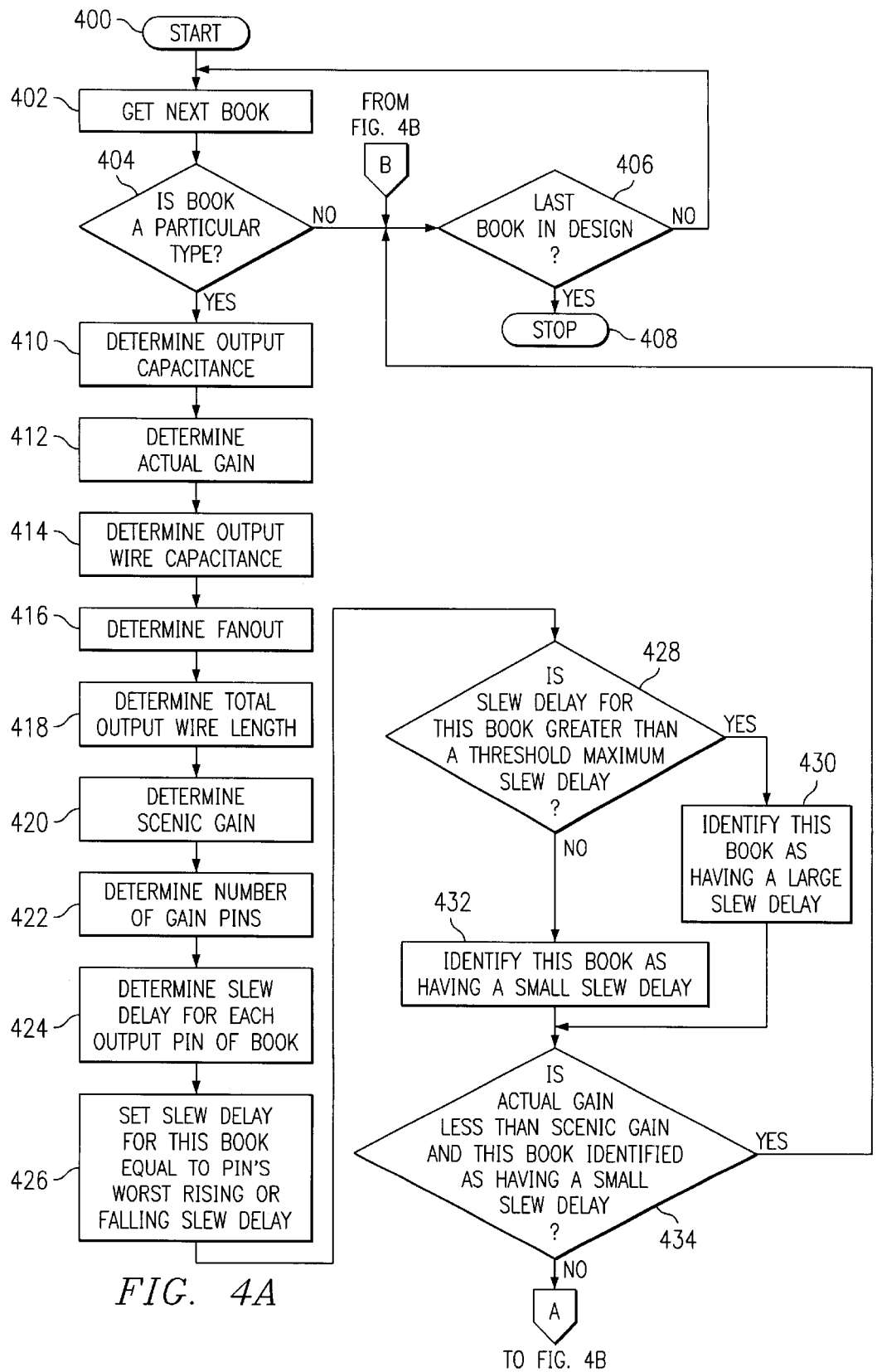
FIGS. 4A–4B are high level flow charts which illustrate the identification of books that may be sensitive to changes in output wire capacitance in accordance with the present invention.
Figure 4B:
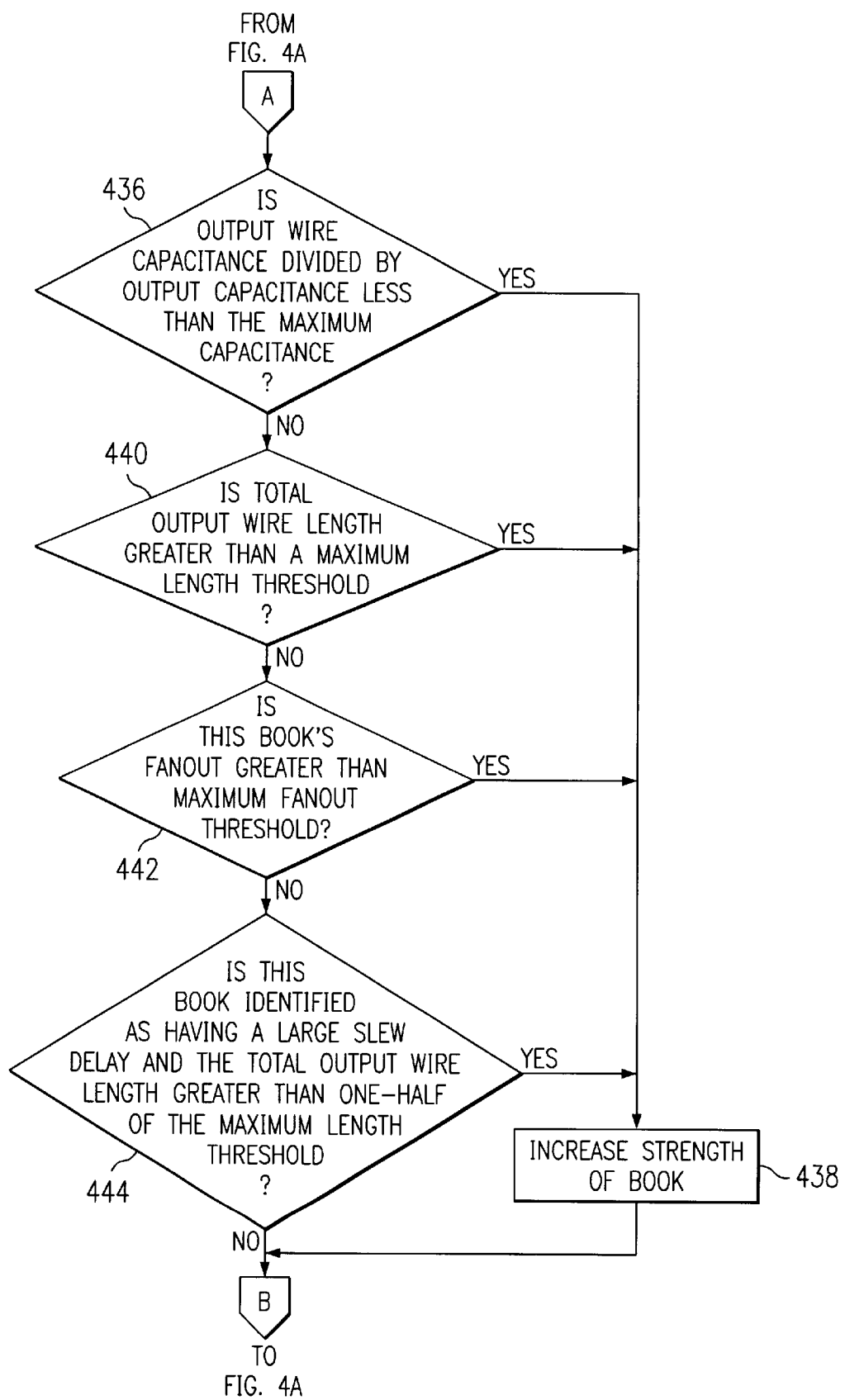

FIGS. 4A–4B are high level flow charts which illustrate the identification of logic books that may be sensitive to changes in output wire capacitance in accordance with the present invention. The process starts as depicted by block 400 and thereafter passes to block 402 which illustrates getting a next book to evaluate. Each book in the circuit design is evaluated. Next, block 404 depicts a determination of whether or not the book currently being evaluated is a particular type of book. Some types of books are not the particular types of books that might be identified. For example, latches will never be identified. If a determination is made that the current book is not a particular type of book, the process passes to block 406. Block 406 illustrates a determination of whether or not the current book is the last book in the circuit design to be evaluated. If a determination is made that the current book is the last book in the circuit design to be evaluated, the process terminates as depicted by block 408. Referring again to block 406, if a determination is made that the current book is not the last book to be evaluated, the process passes back to block 402.

Referring again to block 404, if a determination is made that the current book is a particular type of book, the process passes to block 410 which illustrates determining an output capacitance for the current book. The output capacitance is determined by adding the output wire capacitance of the book to the sum of the capacitance of each output pin. Next, block 412 depicts a determination of an actual gain of the book. The actual gain is determined by dividing the output capacitance by the average input capacitance. The average input capacitance is determined by determining the sum of the capacitance of each input pin and then dividing the sum by the number of input pins.

The process then passes to block 414 which illustrates determining the output wire capacitance. Next, block 416 depicts determining the fanout of the book. The fanout is the number of sink pins driven by this book. Thereafter, block 418 illustrates determining the total output wire length. The total output wire length is determined by dividing the output wire capacitance by the average xy capacitance. During the synthesis process, the logic is being continually reorganized and adjusted. For computational speed, no real routing exists for every net (wire connecting a specific set of pins). Approximate routes are determined which represent feasible routed interconnection, but due to wire congestion they might not be realistic when compared to the actual routed net. The approximate routes can be viewed as a collection of wire segments, some traveling horizontally and some vertically. To determine the probable total length of these segments, the calculated net capacitance can be divided by the capacitance-per-unit-length determined for the manufacturing process. Since the capacitance-per-unit-length is generally different for the horizontal and vertical wires, they can be averaged.

The process then passes to block 420 which depicts determining a scenic gain of this book. The scenic gain is a numerical representation of how hard it is for a logic circuit to drive a specific capacitive load. The more inputs involved, the harder it is to pass current through stacked (serially connected) transistors. P-type transistors do not drive as well as N-type transistors, so NOR circuits with stacked P-type transistors have more trouble driving a load than do NAND circuits with stacked N-type transistors. Scenic gain is the point where a particular circuit begins to respond poorly to increased load. Thus, the scenic gain for NOR circuits or circuits with many inputs is lower. The scenic gain is determined utilizing the following formula:

(maximum gain−(maximum gain−minimum gain)/3)*(gain pins−1), where the maximum gain and minimum gain are constants determined by the particular technology used to actually build the integrated circuit. Using the current technology, the maximum gain constant is 14 and the minimum gain constant is 5.

The number of gain pins is determined by first determining the number of inputs into the current book. The number of gain pins will generally be equal to the number of inputs into the current book. However, for especially sensitive types of books, the number of gain pins is equal to the number of inputs plus "1". For example, NOR books are especially sensitive to changes in output wire capacitance. Therefore, when the book being evaluated is a NOR book, the value of the gain pins is determined by incrementing the number of inputs into the NOR book.

Thereafter, block 422 illustrates determining the number of gain pins. Next, block 424 depicts determining the slew delay for each output pin of the book. Next, block 426 illustrates setting the slew delay for this book equal to the pin's worst rising or falling slew delay. The process then passes to block 428 which depicts a determination of whether or not the slew delay for this book is greater than a threshold maximum slew delay. If a determination is made that the slew delay for this book is greater than the threshold maximum slew delay, the process passes to block 430 which illustrates identifying this book as having a large slew delay. The process then passes to block 434.

Referring again to block 428, if a determination is made that the slew delay for this book is not greater than the threshold maximum slew delay, the process passes to block 432 which illustrates identifying this book as having a small slew delay. The process then passes to block 434.

Block 434, then, depicts a determination of whether or not the actual gain of this book is less than the scenic gain of this book and this book is identified as having a small slew delay. If this book is identified as having both the actual gain less than the scenic gain and a small slew delay, the process passes to block 406. Therefore, books that have a small slew delay and that have an actual gain less than the scenic gain are not identified as being sensitive to changes in output wire capacitance. Referring again to block 434, if this book is identified as having either its actual gain not less than the scenic gain or having a large slew delay, the process passes to block 436. Therefore, the evaluation process continues for books that have either a large slew delay or an actual gain that is not less than the book's scenic gain.

Block 436, then, illustrates a determination of whether or not the output wire capacitance for this book divided by the total output capacitance for this book is less than a maximum capacitance threshold. If a determination is made that the output wire capacitance divided by the total output capacitance is less than a maximum capacitance threshold, the process then passes to block 438. Block 438 depicts increasing the strength of the current book. Referring again to block 436, if a determination is made that the output wire capacitance divided by the total output capacitance is not less than a maximum capacitance threshold, the process passes to block 440.

Block 440 depicts a determination of whether or not the total output wire length for this book is greater than a maximum length threshold. If a determination is made that the total output wire length for this book is greater than the maximum length threshold, the process passes to block 438 which illustrates increasing the strength of this book. Referring again to block 440, if a determination is made that the total output wire length for this book is not greater than a maximum length threshold, the process passes to block 442.

Block 442 depicts a determination of whether or not this book's fanout is greater than a maximum fanout threshold. If a determination is made that this book's fanout is greater than a maximum fanout, the process passes to block 438 which illustrates increasing the strength of this book. Referring again to block 442, if a determination is made that this book's fanout is not greater than a maximum fanout threshold, the process passes to block 444.

Block 444 illustrates a determination of whether or not this book is both identified as having a large slew delay and as having its total output wire length greater than one-half of the maximum length threshold. If a determination is made that this book is both identified as having a large slew delay and as having its total output wire length greater than one-half of the maximum length threshold, the process to block 438 which illustrates increasing the strength of this book. Referring again to block 442, if a determination is made that this book has either a small slew delay or its total output wire length is not greater than one-half of the maximum length threshold, the process passes back to block 406.

Books are identified as being sensitive when they have either a large slew delay or a large gain, as well at least one of the following: (1) a total output wire length over a threshold, (2) the total number of sink pins over a threshold, (3) a large slew delay in combination with a relatively long total output wire, or (4) the ratio of the output wire capacitance to the total output capacitance of the book is over a threshold.

FIG. 5 is a high level flow chart which depicts establishing thresholds to be used during the identification process in accordance with the present invention. The process starts as depicted by block 500 and thereafter passes to block 502 which illustrates establishing a minimum gain constant. Next, block 504 depicts establishing a maximum gain constant. As described above, the minimum and maximum gain constants are dependent on the type of technology used to implement the circuit design. Using the current technology, the minimum gain constant is "5", and the maximum gain constant is "14".

Thereafter, block 506 illustrates establishing a maximum slew delay threshold. The process then passes to block 508 which depicts establishing a maximum wire length threshold. Block 510, then, illustrates establishing a maximum fanout threshold. Thereafter, block 512 depicts establishing a maximum capacitance threshold. The process then terminates as illustrated by block 514.

FIGS. 6A–6D depict software that may be used to implement the present invention.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for correcting anticipated problems related to global routing, said method comprising the steps of:

beginning synthesis of a circuit design, said design including a plurality of logic functions; and during said synthesis:

selecting a plurality of logic books to use to implement said plurality of logic functions;

identifying at least one of said plurality of logic books that is sensitive to a change in output wire capacitance of said al least one of said plurality of logic books by determining an actual gain of each of said plurality of logic books and determining for each of said plurality of logic books if said actual gain is greater than a minimum gain threshold, a value of said output wire capacitance being related to a routing of said wire; and said actual gain being a ratio of output capacitance to average input capacitance for each of said plurality of logic books; and increasing a strength of said identified at least one of said plurality of logic books.

2. The method according to claim 1, further comprising the steps of:

for each one of said plurality of logic books:

determining a capacitance of each output pin of said one of said plurality of logic books;

determining an output capacitance of said one of said plurality of logic books by adding an output capacitance of said one of said plurality of logic books to a sum said determined capacitance of each output sum of said one of said plurality of logic books; and determining an average input capacitance of said one of said plurality of logic books by summing a capacitance of each input pin of said one of said plurality of logic books and dividing the sum by the total number of input pins of said one of said plurality of logic books.

3. The method according to claim 2, further comprising the steps of:

determining a slew delay for each of said plurality of logic books; and determining if said slew delay is greater than a slew delay threshold.

4. The method according to claim 3, further comprising the step of in response to a determination that said actual gain is not greater than said minimum gain threshold and a determination that said slew delay is not greater than said slew delay threshold for one of said plurality of logic books, determining that said one of said plurality of logic books is not sensitive to changes in output wire capacitance.

5. The method according to claim 1, wherein the step of identifying at least one of said plurality of logic books further comprises the steps of:

determining if said actual gain is greater than a scenic gain threshold, wherein a second gain is a numerical representation of a difficulty of one of said plurality of logic books to drive a particular capacitive load.

6. The method according to claim 5, further comprising the steps of:

determining a slew delay for each of said plurality of logic books; and determining if said slew delay is greater than a slew delay threshold.

7. The method according to claim 5, further comprising the steps of:

determining a total output wire length for each of said plurality of logic books; and determining whether said total output wire length is greater than an output wire length threshold.

8. The method according to claim 7, further comprising the step of in response to a determination that said total output wire length is greater than said output wire length threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

9. The method according to claim 5, further comprising the steps of:

determining a fanout for each of said plurality of logic books; and determining whether said fanout is greater than a fanout threshold.

10. The method according to claim 9, further comprising the step of in response to a determination that said fanout is greater than said fanout threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

11. The method according to claim 5, further comprising the steps of:

determining a ratio of an output wire capacitance to a total output capacitance for each of said plurality of logic books; and determining whether said a ratio total is greater than a maximum capacitance threshold.

12. The method according to claim 11, further comprising the step of in response to a determination that said a ratio of an output wire capacitance to a total output capacitance is greater than said maximum capacitance threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

13. The method according to claim 5, further comprising the steps of:

determining a total output wire length for each of said plurality of logic books; and determining whether said total output wire length is greater than one-half of an output wire length threshold.

14. The method according to claim 13, further comprising the step of in response to a determination that said total output wire length is greater than one-half of said output wire length threshold and a determination has been made that said slew delay is greater than said slew delay threshold for one of said plurality of logic books, identifying said one of said plurality of logic books as being sensitive to a change in output wire capacitance.

15. The method according to claim 5, further comprising the step of for each of said plurality of logic books, determining said scenic gain threshold utilizing a number of inputs into each of said plurality of logic books.

16. The method according to claim 15, further comprising the steps of:

for each of said plurality of logic books, determining whether each of said plurality of logic books is a particular type of logic book;

in response to a determination that one of said plurality of logic books is a particular type of logic books, determining a number of inputs into said one of said plurality of logic books;

incrementing said number of inputs; and determining said scenic gain threshold utilizing said incremented number of inputs.

17. A data processing system for connecting anticipated problems related to global routing, comprising:
   a circuit design having a plurality of logic functions;
   said system including a CPU executing code for beginning synthesis of said circuit design;
   during said synthesis:
      said CPU executing code for selecting a plurality of logic books to use to implement said plurality of logic functions;
      said CPU executing code for identifying at least one of said plurality of logic books that is sensitive to a change in output wire capacitance of said at least one of said plurality of logic books by determining an actual gain of each of said plurality of logic books and determining for each of said plurality of logic books if said actual gain is greater than a minimum in gain threshold, a value of said output wire capacitance being related to a routing of said wire; and
      said actual gain being a ratio of output capacitance to average input capacitance for each of said plurality of logic books; and
      said CPU executing code for increasing a strength of said identified at least one of said plurality of logic books.

18. The system according to claim 17, further comprising: for each one of said plurality of logic books:
   said CPU executing code for determining a capacitance of each output pin of said one of said plurality of logic books;
   said CPU executing code for determining an output capacitance of said one of said plurality of logic books by adding an output wire capacitance of said one of said plurality of logic books to a sum of said determined capacitance of each output pin of said one of said plurality of logic books; and
   said CPU executing code for determining an average input capacitance of said one of said plurality of logic books by summing a capacitance of each input pin of said one of said plurality of logic books and dividing the sum by the total number or input pins of said one of said plurality of logic books.

19. The system according to claim 18, further comprising:
   said CPU executing code for determining a slew delay for each of said plurality of logic books; and
   said CPU executing code for determining if said slew delay is greater than a slew delay threshold.

20. The system according to claim 19, further comprising in response to a determination that said actual gain is not greater than said minimum gain threshold and a determination that said slew delay is not greater than said slew delay threshold for one of said plurality of logic books, said CPU executing code for determining that said one of said plurality of logic books is not sensitive to changes in output wire capacitance.

21. The system according to claim 17, wherein said CPU executing code for identifying at least one of said plurality of logic books further comprises:
   said CPU executing code for determining if said actual gain is greater than a scenic gain threshold, wherein a scenic is a numerical representation of a difficulty of one of said plurality of logic books to drive a particular capacitive load.

22. The system according to claim 21, further comprising:
   said CPU executing code for determining a slew delay for each of said plurality of logic books; and
   said CPU executing code for determining if said slew delay is greater than a slew delay threshold.

23. The system according to claim 21, further comprising:
   said CPU executing code for determining a total output wire length for each of said plurality of logic books; and
   said CPU executing code for determining whether said total output wire length is greater than an output wire length threshold.

24. The system according to claim 23, further comprising said CPU executing code for in response to a determination that said total output wire length is greater than said output wire length threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

25. The system according to claim 21, further comprising:
   said CPU executing code for determining a fanout for each of said plurality of logic books; and
   said CPU executing code for determining whether said fanout is greater than a fanout threshold.

26. The system according to claim 25, further comprising in response to a determination that said fanout is greater than said fanout threshold and either a determination has been made that said actual gain is greater than said scenic gain threshold or a determination has been made that said slew delay is greater than said slew delay threshold for one of said plurality of logic books, said CPU executing code for identifying said one of said plurality of logic books as being sensitive to a change in output wire capacitance.

27. The system according to claim 21, further comprising:
   said CPU executing code for determining a ratio of an output wire capacitance to a total output capacitance for each of said plurality of logic books; and
   said CPU executing code for determining whether said ratio is greater than a maximum capacitance threshold.

28. The system according to claim 27, further comprising in response to a determination that said a ratio of an output wire capacitance to a total output capacitance is greater than said maximum capacitance threshold and either a determination has been made that said actual gain is greater than said scenic gain threshold or a determination has been made that said slew delay is greater than said slew delay threshold for one of said plurality of logic books said CPU executing code for identifying said one of said plurality of logic books as being sensitive to a change in output wire capacitance.

29. The system according to claim 21, further comprising:
   said CPU executing code for determining a total output wire length for each of said plurality of logic books; and
   said CPU executing code for determining whether said total output wire length is greater than one-half of an output wire length threshold.

30. The system according to claim 29, further comprising said CPU executing code for in response to a determination that said total output wire length is greater than one-half of said output wire length threshold and a determination has been made that said stew delay is greater than said slew delay threshold for one of said plurality of logic books, identifying said one of said plurality of logic books as being sensitive to a change in output wire capacitance.

31. The system according to claim 21, further comprising said CPU executing code for each of said plurality of logic books, for determining said scenic gain threshold utilizing a number of inputs into each of said plurality of logic books.

32. The system according to claim 31, further comprising:
said CPU executing code for each of said plurality of logic books, for determining whether each of said plurality of logic books is a particular type of logic book;
said CPU executing code for in response to a determination tat one of said plurality of logic books is a particular type of logic books, determining a number of inputs into said one of said plurality of logic books;
said CPU executing code for incrementing said number of inputs; and
said CPU executing code for determining said scenic gain threshold utilizing said incremented number of inputs.

33. A computer program product in a data processing system for correcting anticipated problems related to global routing, said computer program product comprising:
instruction means for beginning synthesis of a circuit design, said design including a plurality of logic functions; and
during said synthesis:
instruction means for selecting a plurality of logic books to use to implement said plurality of logic functions;
instruction means for identifying at least one of said plurality of logic books that is sensitive to a change in output wire capacitance of said at least one of said plurality of logic books by determining an actual gain of each of said plurality of logic books and determining for each of said plurality of logic books if said actual gain is greater than a minimum gain threshold, a value of said output wire capacitance being related to a routing of said wire;
said actual gain being a ratio of output capacitance to average input capacitance for each of said plurality of logic books; and
instruction means for increasing a strength of said identified at least one of said plurality of logic books.

34. The product according to claim 33, further comprising for each one of said plurality of logic books:
instruction means for determining capacitance of each output pin of said one of said plurality of logic books;
instruction means for determining an output capacitance of said one of said plurality of logic books by adding an output wire capacitance of said one of said plurality of logic books to a sum of said determined capacitance of each output pin of said one of said plurality of logic books; and
instruction means for determining an average input capacitance of said one of said plurality of logic books by summing a capacitance of each input pin of said one of said plurality of logic books and dividing the sum by the total number of input pins of said plurality of logic books.

35. The product according to claim 34, further comprising:
instruction means for determining a slew delay for each of said plurality of logic books; and
instruction means for determining if said slew delay is greater than a slew delay threshold.

36. The product according to claim 35, further comprising instruction means for in response to a determination that said actual gain is not greater than said minimum gain threshold and a determination that said slew delay is not greater than said slew delay threshold for one of said plurality of logic books, determining that said one of said plurality of logic books is not sensitive to changes in output wire capacitance.

37. The product according to claim 33, wherein said instruction means for identifying at least one of said plurality of logic books further comprises:
instructions means for determining if said actual gain is greater than a scenic gain threshold, wherein a scenic gain is a numerical representation of a difficulty of one of said plurality of logic books to drive a particular capacitive load.

38. The product according to claim 37, further comprising:
instruction means for determining a slew delay for each of said plurality of logic books; and
instruction means for determining if said slew delay is greater than a slew delay threshold.

39. The product according to claim 37, further comprising:
instruction means for determining a total output wire length for each of said plurality of logic books; and
instruction means for determining whether said total output wire length is greater than an output wire length threshold.

40. The product according to claim 39, further comprising instruction means for in response to a determination that said total output wire length is greater than said output wire length threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

41. The product according to claim 37, further comprising:
instruction means for determining a fanout for each of said plurality of logic books; and
instruction means for determining whether said fanout is greater than a fanout threshold.

42. The product according to claim 41, further comprising instruction means for in response to a determination that said fanout is greater than said fanout threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

43. The product according to claim 37, further comprising:
instruction means for determining a ratio of an output wire capacitance to a total output capacitance for each of said plurality of logic books; and
instruction means for determining whether said a ratio is greater than a maximum capacitance threshold.

44. The product according to claim 43, further comprising instruction means for in response to a determination that said a ratio of an output wire capacitance to a total output capacitance is greater than said maximum capacitance threshold and either a determination has been made that said actual gain is greater than said scenic gain threshold or a determination has been made that said slew delay is greater than said slew delay threshold for one of said plurality of logic books, identifying said one of said plurality of logic books as being sensitive to a change in output wire capacitance.

45. The product according to claim 37, further comprising:
   instruction means for determining a total output wire length for each of said plurality of logic books; and
   instruction means for determining whether said total output wire length is greater than one-half of an output wire length threshold.

46. The product according to claim 45, further comprising instruction means for in response to a determination that said total output wire length is greater than one-half of said output wire length threshold and a determination has been made that said slew delay is greater than said slew delay threshold for one of said plurality of logic books, identifying said one of said plurality of logic books as being sensitive to a change in output wire capacitance.

47. The product according to claim 37, further comprising instruction means for each of said plurality of logic books, for determining said scenic gain threshold utilizing a number of inputs into each of said plurality of logic books.

48. The product according to claim 47, further comprising:
   instruction means for each of said plurality of logic books, for determining whether each of said plurality of logic books is a particular type of logic book;
   in response to a determination that one of said plurality of logic books is a particular type of logic books, instruction means for determining a number of inputs into said one of said plurality of logic books;
   instruction means for incrementing said number of inputs; and
   incremented means for determining said scenic gain threshold utilizing said incremented number of inputs.

49. A method in a data processing system for correcting anticipated problems related to global witting, said method comprising the steps of:
   beginning synthesis of a circuit design, said design including a plurality of logic functions; and
   during said synthesis:
      selecting a plurality of logic books to use to implement said plurality of logic functions;
      identifying at least one of said plurality of logic books that is sensitive to a change in output wire capacitance of said at least one of said plurality of logic books, a value of said output wire capacitance being related to a routing of said wire;
      wherein the step of identifying at last one of said plurality of logic books further comprises the steps of:
         determining an actual gain of each of said plurality of logic books; and
         determining if said actual gain is greater than a scenic gain threshold;
         increasing a strength of said identified at least one of said plurality of logic books;
      determining a ratio of an output wire capacitance to a total output capacitance for each of said plurality of logic books; and
      determining whether said ratio of an output wire capacitance to a total output capacitance is greater than a maximum capacitance threshold.

50. The method according to claim 49, further comprising the step of in response to a determination that said ratio of an output wire capacitance to a total output capacitance is greater than said maximum capacitance threshold and either a determination has been made that said actual gain is greater than said scenic gain threshold or a determination has been made that said slew delay is greater than said slew delay threshold for one of said plurality of logic books, identifying said one of said plurality of logic books as being sensitive to a exchange in output wire capacitance.

51. The method according to claim 49, further comprising the steps of:
   determining a total output wire length for each of said plurality of logic books; and
   determining whether said total output wire length is greater than one-half of an output wire length threshold.

52. The method according to claim 51, further comprising the step of in response to a determination that said total output wire length is greater than one-half of said output wire length threshold and a determination has been made that said slew delay is greater than said slew delay threshold for one of said plurality of logic books, identifying said one of said plurality of logic books as being sensitive to a change in output wire capacitance.

53. The method according to claim 49, further comprising the steps of:
   for each of said plurality of logic books, determining said scenic gain threshold utilizing a number of inputs into each of said plurality of logic books;
   for each of said plurality of logic books, determining whether each of said plurality of logic books is a particular type of logic book;
   in response to a determination that one of said plurality of logic books is a particular type of logic books, determining a number of inputs into said one of said plurality of logic books;
   incrementing said number of inputs; and
   determining said scenic gain threshold utilizing said incremented number of inputs.

54. A data processing system for correcting anticipated problems related to global routing, comprising:
   a circuit design having a plurality of logic functions;
   said system including a CPU executing code for beginning synthesis of said circuit design;
   during said synthesis:
      said CPU executing code for selecting a plurality of logic books to use to implement said plurality of logic function;
      said CPU executing code for identifying at least one of said plurality of logic books that is sensitive to a change in output wire capacitance of said at least one of said plurality of logic books, a value of said output wire capacitance being related to a routing of said wire;
      wherein said CPU executing code for identifying at least one of said plurality of logic books further comprises:
         said CPU executing code for determining an actual gain of each of said plurality of logic books; and
         said CPU executing code for determining if said actual gain is greater than a scenic gain threshold;
         said CPU executing code for increasing a strength of said identified at least one of said plurality of logic books;
      said CPU executing code for determining a ratio of an output wire capacitance to a total output capacitance for each of said plurality of logic books; and
      said CPU executing code for determining whether said ratio of an output wire capacitance to a total output capacitance is greater than a maximum capacitance threshold.

55. The system according to claim 54, further comprising in response to a determination that said ratio of an output wire capacitance to a total output capacitance is greater than said maximum capacitance threshold and either a determination has been made that said actual gain is greater than said actual gain threshold or a determination has been made that said slew delay is greater than said slew delay threshold for one of said plurality of logic books, said CPU executing code for identifying said one of said plurality of logic books as being sensitive to a change in output wire capacitance.

56. The system according to claim 54, further comprising:
said CPU executing code for determining a total output wire length for each of said plurality of logic books; and
said CPU executing code for determining whether said total output wire length is greater than one-half of an output wire length threshold.

57. The system according to claim 56, further comprising in response to a determination that said total output wire length is greater than one-half of said output wire length threshold and a determination has been made that said slew delay is greater than said slew delay threshold for one of said plurality of logic books, said CPU executing code for identifying said one of said plurality of logic books as being sensitive to a change in output wire capacitance.

58. The system according to claim 54, further comprising:
for each of said plurality of logic books, said CPU executing code for determining said scenic gain threshold utilizing a number of inputs into each of said plurality of logic books;
for each of said plurality of logic books, said CPU executing code for determining whether each of said plurality of logic books is a particular type of logic book;
in response to a determination that one of said plurality of logic books is a particular type of logic books, said CPU executing code for determining a number of inputs into said one of said plurality of logic books;
said CPU executing code for incrementing said number of inputs; and
said CPU executing code for determining said scenic gain threshold utilizing said incremented number of inputs.

59. A computer program product in a data processing system for correcting anticipated problems related to global routing, said product comprising:
instruction means for beginning synthesis of a circuit design, said design including a plurality or logic functions; and
during said synthesis:
instruction means for selecting a plurality of logic books to use to implement said plurality of logic functions;
instructions means for identifying at least one of said plurality of logic books that is sensitive to a change in output wire capacitance of said at least one of said plurality of logic books, a value of said output wire capacitance being related to a routing of said wire;
wherein said instruction means for identifying at least one of said plurality of logic books further comprises:
instruction means for determining an actual gain of each of said plurality of logic books; and
instruction means for determining if said actual gain is greater than a scenic gain threshold;
instruction means for increasing a strength of said identified at least one of said plurality of logic books;
instruction means for determining a ratio of an output wire capacitance to a total output capacitance for each of said plurality of logic books; and
instruction means for determining whether said ratio of an output wire capacitance to a total output capacitance is greater than a maximum capacitance threshold.

60. The product according to claim 59, further comprising instruction means in response to a determination that said ratio of an output wire capacitance to a total output capacitance is greater than said maximum capacitance threshold and either a determination has been made that said actual gain is greater than said scenic gain threshold or a determination has been made that said slew delay is greater than said slew delay threshold for one of said plurality of logic books, for identifying said one of said plurality of logic books as being sensitive to a change in output wire capacitance.

61. The computer program product according to claim 59, further comprising:
instruction means for determining a total output wire length for each of said plurality of logic books; and
instruction means for determining whether said total output wire length is greater than one-half of an output wire length threshold.

62. The product according to claim 61, further comprising in response to a determination that said total output wire length is greater than one-half of said output wire length threshold and a determination has been made that said slew delay is greater than said slew delay threshold for one of said plurality of logic books, instruction means for identifying said one of said plurality of logic books as being sensitive to a change in output wire capacitance.

63. The computer program product according to claim 59, further comprising:
for each of said plurality of logic books, instructions means for determining said scenic gain threshold utilizing a number of inputs into each of said plurality of logic books;
for each of said plurality of logic books, instruction means for determining whether each of said plurality of logic books is a particular type of logic book;
in response to a determination that one of said plurality of logic books is a particular type of logic books, instruction means for determining a number of inputs into said one of said plurality of logic books;
instruction means for incrementing said number of inputs; and
instruction means for determining said scenic gain threshold utilizing said incremented number of pins.

* * * * *

UNITED STATES PATENT AND TRADEMARK OFFICE
CERTIFICATE OF CORRECTION

PATENT NO.    : 6,654,943 B2
DATED         : November 25, 2003
INVENTOR(S)   : Clabes et al.

It is certified that error appears in the above-identified patent and that said Letters Patent is hereby corrected as shown below:

Column 3,
Line 7, after "identification of" insert -- logic --.

Column 9,
Line 1, after "tance of said" delete "a1" and insert -- at --.
Line 7, after "wire;" delete "and".
Line 19, after "output" insert -- wire --.
Line 21, after "sum" insert -- of --.
Line 22, before "of said one" delete "sum" and insert -- pin --.
Line 46, after "wherein a" delete "second" and insert -- scenic --.

Column 10,
Line 25, after "said" delete "a ratio total" and insert -- ratio --.
Line 28, after "said" delete "a".

Column 11,
Line 17, before "gain" delete "in".
Line 18, after "wire;" delete "and".
Line 40, after "number" delete "or" and insert -- of --.

Column 12,
Line 39, after "said" delete "a".
Line 45, after "books" insert -- , --.

Column 13,
Line 6, after "tion" delete "tat" and insert -- that --.
Line 39, after "determining" insert -- a --.
Line 53, before "plurality" insert -- one of said --.

Column 14,
Line 52, after "said" delete "a".
Line 56, before "ratio" delete "a".

Column 15,
Line 31, before "means" delete "incremented" and insert -- instruction --.
Line 34, after "global" delete "witting" and insert -- routing --.

UNITED STATES PATENT AND TRADEMARK OFFICE
CERTIFICATE OF CORRECTION

PATENT NO. : 6,654,943 B2
DATED : November 25, 2003
INVENTOR(S) : Clabes et al.

It is certified that error appears in the above-identified patent and that said Letters Patent is hereby corrected as shown below:

Column 16,
Line 5, after "sensitive to a" delete "exchange" and insert -- change --.
Line 44, after "logic" delete "function" and insert -- functions --.

Column 18,
Line 43, after "books," delete "instructions" and insert -- instruction --.

Signed and Sealed this

Twenty-first Day of February, 2006

JON W. DUDAS
*Director of the United States Patent and Trademark Office*